(12) United States Patent
Wei et al.

(10) Patent No.: US 7,763,515 B2
(45) Date of Patent: Jul. 27, 2010

(54) TRANSISTOR WITH EMBEDDED SILICON/GERMANIUM MATERIAL ON A STRAINED SEMICONDUCTOR ON INSULATOR SUBSTRATE

(75) Inventors: Andy Wei, Dresden (DE); Thorsten Kammler, Ottendorf-Okrilla (DE); Roman Boschke, Dresden (DE); Manfred Horstmann, Duerrrhoerhrsdorf-Dittersbach (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 200 days.

(21) Appl. No.: 11/843,358

(22) Filed: Aug. 22, 2007

(65) Prior Publication Data
US 2008/0179628 A1    Jul. 31, 2008

(30) Foreign Application Priority Data
Jan. 31, 2007    (DE)    ....................... 10 2007 004 861

(51) Int. Cl.
*H01L 21/8234*    (2006.01)
(52) U.S. Cl. ................. 438/275; 438/938; 257/E21.642
(58) Field of Classification Search ......... 438/478–509, 438/938
See application file for complete search history.

(56) References Cited

U.S. PATENT DOCUMENTS

| | | | | |
|---|---|---|---|---|
| 6,911,379 | B2 * | 6/2005 | Yeo et al. | 438/480 |
| 7,199,451 | B2 * | 4/2007 | Kelman | 257/627 |
| 7,223,994 | B2 * | 5/2007 | Chidambarrao et al. | 257/18 |
| 2005/0070070 | A1 | 3/2005 | Rim | 438/406 |
| 2006/0001088 | A1 | 1/2006 | Chan et al. | 257/347 |
| 2006/0118878 | A1 | 6/2006 | Huang et al. | 257/369 |
| 2006/0160291 | A1 | 7/2006 | Lee et al. | 438/199 |
| 2006/0186470 | A1 | 8/2006 | Chen et al. | 257/344 |
| 2006/0189053 | A1 * | 8/2006 | Wang et al. | 438/197 |

FOREIGN PATENT DOCUMENTS

| | | |
|---|---|---|
| DE | 11 2004 002 409 T5 | 10/2006 |
| WO | WO 2007/002215 | 1/2007 |

OTHER PUBLICATIONS

Wei et al., Effectiveness of Embedded-SiGe in Strained-SOI Substrates and Implications on Embedded-SiGe Stress Transfer Mechanics, Oct. 29, 2006, ESC Transactions, The Electrochemical Society, vol. 3, No. 7, pp. 719-725.*

(Continued)

*Primary Examiner*—Chandra Chaudhari
(74) *Attorney, Agent, or Firm*—Williams, Morgan & Amerson, P.C.

(57) ABSTRACT

By combining a respectively adapted lattice mismatch between a first semiconductor material in a channel region and an embedded second semiconductor material in an source/drain region of a transistor, the strain transfer into the channel region is increased. According to one embodiment of the invention, the lattice mismatch may be adapted by a biaxial strain in the first semiconductor material. According to one embodiment, the lattice mismatch may be adjusted by a biaxial strain in the first semiconductor material. In particular, the strain transfer of strain sources including the embedded second semiconductor material as well as a strained overlayer is increased. According to one illustrative embodiment, regions of different biaxial strain may be provided for different transistor types.

14 Claims, 9 Drawing Sheets

OTHER PUBLICATIONS

Mizuno et al., "High Velocity Electron Injection MOSFETs for Ballistic Transistors using Si/Ge/Strained-Si Heterojunction Source Structures," *2004 Symposium on VLSI Technology Digest of Technical Papers*, pp. 202-203, 2004.

Radu et al., "sSOI fabrication by wafer bonding and layer splitting of thin SiGe virtual substrates," *Materials Science and Engineering*, 138:231-34, 2006.

Wei et al., "Effectiveness of Embedded-SiGe in Strained-SOI Substrates and Implications on Embedded-SiGe Stress Transfer Mechanics," *ECS Transactions*, 3:719-25, 2006.

Wong et al., "Comparison of DC, RF, and Dispersion Properties of SOI and Strained-SOI N-MOSFETs," *IEEE ISIE*, pp. 1155-1158, 2005.

International Search Report and Written Opinion from PCT/US2008/001408 dated Jun. 10, 2008.

Translation of Official Communication from German Patent Application No. 10 2007 004 861.2 dated Jun. 26, 2008.

\* cited by examiner

TRANSISTOR WITH EMBEDDED SILICON/GERMANIUM MATERIAL ON A STRAINED SEMICONDUCTOR ON INSULATOR SUBSTRATE

BACKGROUND OF THE INVENTION

1. Field of the Invention

Generally, the present disclosure relates to the fabrication of integrated circuits, and, more particularly to the formation of transistors having strained channel regions by using embedded silicon/germanium (Si/Ge) to enhance charge carrier mobility in the channel regions of the transistors.

2. Description of the Related Art

The fabrication of complex integrated circuits requires the provision of a large number of transistor elements, which are used in logic circuits as efficient switches and which represent the dominant circuit element for designing circuits. Generally, a plurality of process technologies are currently practiced, wherein, for complex circuitry, such as micro-processors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates to design highly complex circuit assemblies, such as CPUs, storage chips and the like. During the fabrication of complex integrated circuits using CMOS technology, millions of transistors, i.e., N-channel transistors and P-channel transistors, are formed on a substrate including a crystalline semiconductor layer. A transistor or MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for obtaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer next to the channel region to induce a compressive stress that may result in a corresponding strain. The transistor performance of P-channel transistors may be considerably enhanced by the introduction of stress-creating layers next to the channel region. For this purpose, a strained silicon/germanium layer may be formed in the drain and source regions of the transistors, wherein the compressively strained drain and source regions create uniaxial strain in the adjacent silicon channel region. When forming the silicon/germanium layer, the drain and source regions of the PMOS transistors are selectively recessed, while the NMOS transistors are masked and subsequently the silicon/germanium layer is selectively formed in the PMOS transistor by epitaxial growth. Although this technique offers significant advantages in view of performance gain of the PMOS transistor and thus of the entire CMOS device, an appropriate design may have to be used that balances the difference caused by the performance gain of the PMOS transistor, while the NMOS transistor may not efficiently contribute to the overall device performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative method disclosed herein comprises providing a base comprising a biaxially strained first semiconductor material. The base is then bonded to a substrate. The strained first semiconductor material is then exposed to provide a surface of the strained first semiconductor material, wherein the surface is opposite the substrate. A second semiconductor material is then embedded in the biaxially strained first semiconductor material in a source/drain region of a first transistor, wherein the source/drain regions have a channel region comprising the biaxially strained first semiconductor material therebetween. The first semiconductor material, the biaxial strain and the second semiconductor material are selected such that, compared to an unstrained first semiconductor material, the biaxial strain in the first semiconductor material acts to influence a lattice mismatch at an interface portion between the first semiconductor material in the channel region and the second semiconductor material so as to increase strain transfer from the embedded second semiconductor to the channel region.

One illustrative device disclosed herein comprises a first semiconductor material over an insulator, wherein the first semiconductor material layer is biaxially strained. A source/drain region of the transistor comprises a second semiconductor material embedded in the first semiconductor material. A channel region between the source/drain region comprises the first semiconductor material. With respect to an unstrained first semiconductor material, the biaxial strain in the first semiconductor material acts to influence a lattice mismatch at an interface portion between the first semiconductor material in the channel region and the second semiconductor material to increase strain transfer from the embedded second semiconductor to the channel region.

Another illustrative device disclosed herein comprises a first semiconductor material over an insulator and a second semiconductor material embedded in the first semiconductor material in a source/drain region. A channel region between the source region and the drain region comprises the first semiconductor material. An interface portion between the first semiconductor material and the second semiconductor material has a lattice mismatch between the first semiconductor material and the second semiconductor material. The interface portion extends in a direction crosswise the channel region to a predetermined depth wherein the thickness of the first semiconductor material under the second semiconductor material is 10 nm or less.

BRIEF DESCRIPTION OF THE DRAWINGS

The disclosure may be understood by reference to the following description taken in conjunction with the accompanying drawings, in which like reference numerals identify like elements, and in which.

Figure 1:
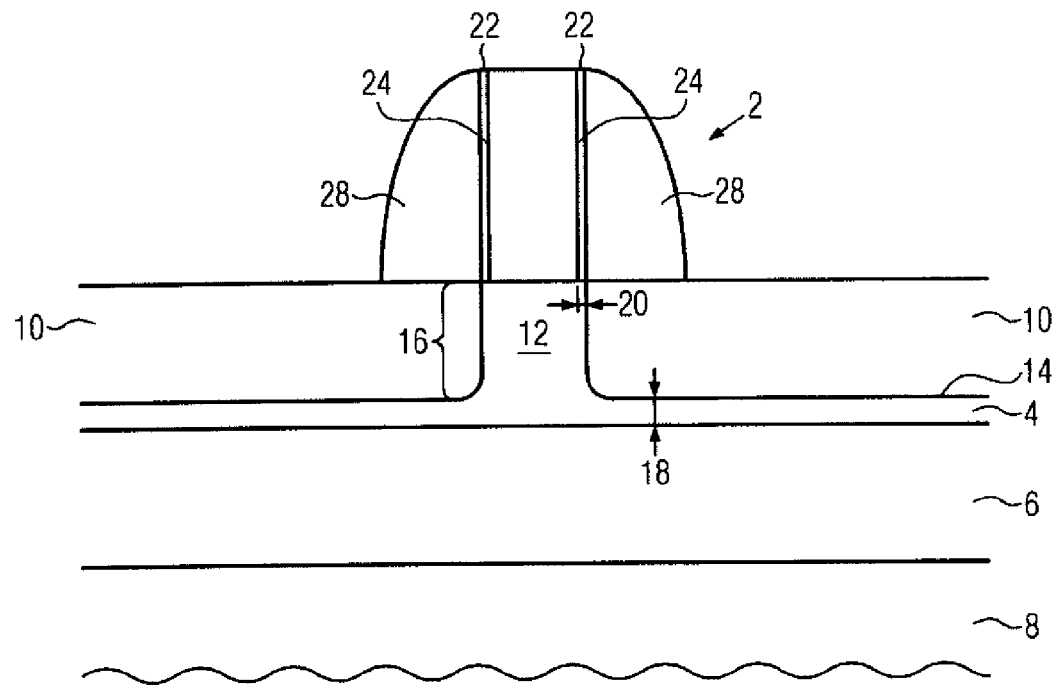
FIGS. 1-2 schematically illustrate cross-sectional views of a semiconductor device comprising a transistor according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

It should be noted that, throughout this application, "%" means "atomic %" unless otherwise specified. Further, throughout this application, silicon/germanium or Si/Ge refers to a silicon/germanium alloy. Further, throughout this application, "in-plane" refers to a plane of the channel region, i.e., a plane which is spanned by a direction of a channel length and a direction of a channel width. Accordingly "out-of-plane" refers to a direction cross-wise the channel region.

Generally, the present subject matter relates to a technique for increasing stress transfer into a channel region of a transistor, thereby increasing charge carrier mobility and the overall performance of the transistor.

First, a transistor formed in a first semiconductor material, e.g., in and above the first semiconductor material, is considered. An embodiment of this kind is shown in FIG. 1. A PMOS transistor 2 is formed in and above a first semiconductor material 4 on an insulator 6. In the embodiment shown in FIG. 1, the first semiconductor material is silicon. The insulator 6 is formed on a substrate 8, which is made of silicon in the embodiment shown in FIG. 1. Alternatively, the substrate 8 may be of any material that is suitable for carrying the insulator 6 and the silicon layer. The insulator 6 may be formed of any suitable material, e.g., silicon dioxide.

Source/drain regions 10 of the transistor 2 are formed of a second semiconductor material 9. The second semiconductor material may be comprised of a variety of materials, e.g., silicon, germanium, etc. In the illustrative embodiment shown in FIG. 1, the source/drain regions are formed of silicon/germanium (Si/Ge). The source/drain regions 10 are embedded, i.e., recessed in the first semiconductor material 4. Between the source/drain regions 10, a channel region 12 is formed in the first semiconductor layer, i.e., the channel region 12 comprises the first semiconductor material 4. Between the first semiconductor material 4 and the second semiconductor material 10 forms an interface 14. Of this interface 14, a portion 16 extends along the width direction of channel region 12 in a direction that is substantially perpendicular to the direction of current flow through the channel region 12, e.g., in a vertical direction as shown in FIG. 1. Since the lattice constant of silicon/germanium is larger than the lattice constant of silicon, a lattice mismatch occurs at the interface portion 16.

According to a principle disclosed herein, i.e., employing a lattice mismatch between the first semiconductor material 4 and the second semiconductor material 9 in a direction that is substantially perpendicular to the channel region 12 in order to enhance a stress transfer from the second semiconductor material to the channel region 12, the interface portion 16 extends to a predetermined depth such that the thickness 18 of the first semiconductor material 4 under the second semiconductor material 9 is 10 nm or less. For example, the thickness 18 of the first semiconductor material 4 under the second semiconductor layer 9 may be between approximately 1-10 nm. According to another embodiment, the thickness 18 may be between approximately 2-8 nm. According to yet another embodiment, the thickness 18 may be between approximately 3-7 nm. According to yet another embodiment, the thickness 18 may be between approximately 4-6 nm. For example, the thickness 18 may be 5 nm.

Alternatively or additionally, the stress transfer from the second semiconductor material 9 to the channel region 12 may be increased by forming the interface portion 16 which extends substantially perpendicular to the direction of current flow through the channel region 12 close to the channel region 12. According to one embodiment, the distance 20 between the interface portion 16 and the channel region 12 is between approximately 0.7-7 nm. According to another embodiment, the distance 20 is between approximately 1-5 nm. According to another embodiment, the distance 20 is between approximately 1.5-3 nm. The distance 20 between the interface portion 16 and the channel region 12 may be adjusted by providing respective sidewall spacers 22 on the sides 24 of a gate electrode 26, wherein the sidewall spacers 22 may be used as a mask for the formation of the second semiconductor material 9 in the first semiconductor material 4. The sidewall spacers 22 may be further used as a template for an implantation mask 28 which is provided to generate a predetermined spatial distribution of a dopant.

Alternatively or additionally, a compressive stress transfer from the second semiconductor material 9 to the channel region 12 may be increased by increasing the lattice mismatch at the interface portion 16 extending in a direction substantially perpendicular to the direction of current flow through the channel region 12 as much as possible. The lattice mismatch at the interface portion 16 may be increased by increasing the difference in lattice constant of the first semiconductor material 4 and the second semiconductor material 9. In the embodiment shown in FIG. 1, wherein the first semiconductor material 4 is silicon and the second semiconductor material 9 is silicon/germanium, the lattice mismatch at the interface portion 16 may be increased by increasing the germanium content. A maximum drive current increase was found for about 25-35% germanium. However, once this germanium content is reached, no further improvement appears to be available for embedded silicon/germanium in silicon-on-insulator (SOI).

Figure 2:
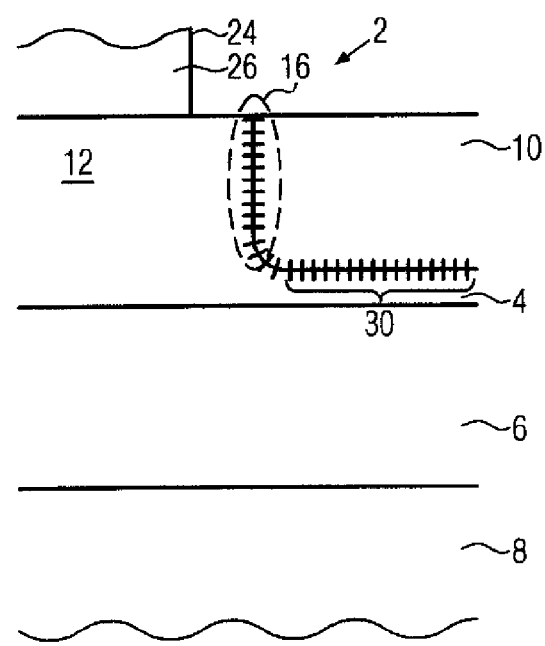

FIG. 2 schematically illustrates an enlarged partial view of another embodiment of a PMOS transistor 2. The PMOS transistor in FIG. 2 is similar to the PMOS transistor 2 shown in FIG. 1. Accordingly, the details specified with respect to FIG. 1 are not repeated here. The transistor of FIG. 2 does not include sidewall spacers 22 or implantation masks 28. FIG. 2 schematically indicates the lattice constants of the first semiconductor material 4 and the second semiconductor material 9. In particular, FIG. 2 illustrates the lattice mismatch in the interface portion 16 extending in a direction substantially perpendicular to the direction of current flow through the channel region 12 between the first semiconductor material 4 and the second semiconductor material 9. In the embodiment shown in FIG. 2, a lateral interface portion 30 extending in a direction substantially parallel to the direction of current flow through to the channel region 12 schematically illustrates a non-epitaxial growth of the second semiconductor material 9 on the first semiconductor material 4. However, depending on process parameters, the second semiconductor material 9 may be epitaxially grown on the first semiconductor material 4 in the lateral interface portion 30. It should be understood the "direction parallel to the channel region 12" includes deviations from "parallel" in a mathematical sense. For example, an interface portion 30 tilted by about 10 degrees is considered "parallel" in this context.

According to one illustrative embodiment disclosed herein, the stress transfer into a P-channel region 12 of a P-channel transistor may be increased by providing a biaxial strain in the silicon material 4 in which the transistor is formed. It is believed that the stress transfer into the channel region 12 of an N-channel transistor may be enhanced by an appropriate biaxial strain in the semiconductor material 4 at which the N-channel transistor is formed. Employing the subject matter disclosed herein with silicon and silicon/germanium, well-established process techniques developed for these materials may be efficiently used for enhancing the charge carrier mobility in P-channel transistors and N-channel transistors. Thus, in some illustrative embodiments, an embedded semiconductor material or alloy 9 in the form of silicon/germanium in a biaxially strained silicon-on-insulator may be used in an appropriate configuration so as to induce a respective compressive strain in the channel region 12 of a P-channel transistor which is substantially increased compared to an unstrained silicon-on-insulator configuration. In the case of silicon/germanium, well-established selective epitaxial growth techniques may be used in combination with advanced masking regimes in order to provide the semiconductor material or alloy 9 in an appropriate configuration for inducing the desired type of strain while also providing a high degree of process compatibility with conventional process techniques.

Figure 3:
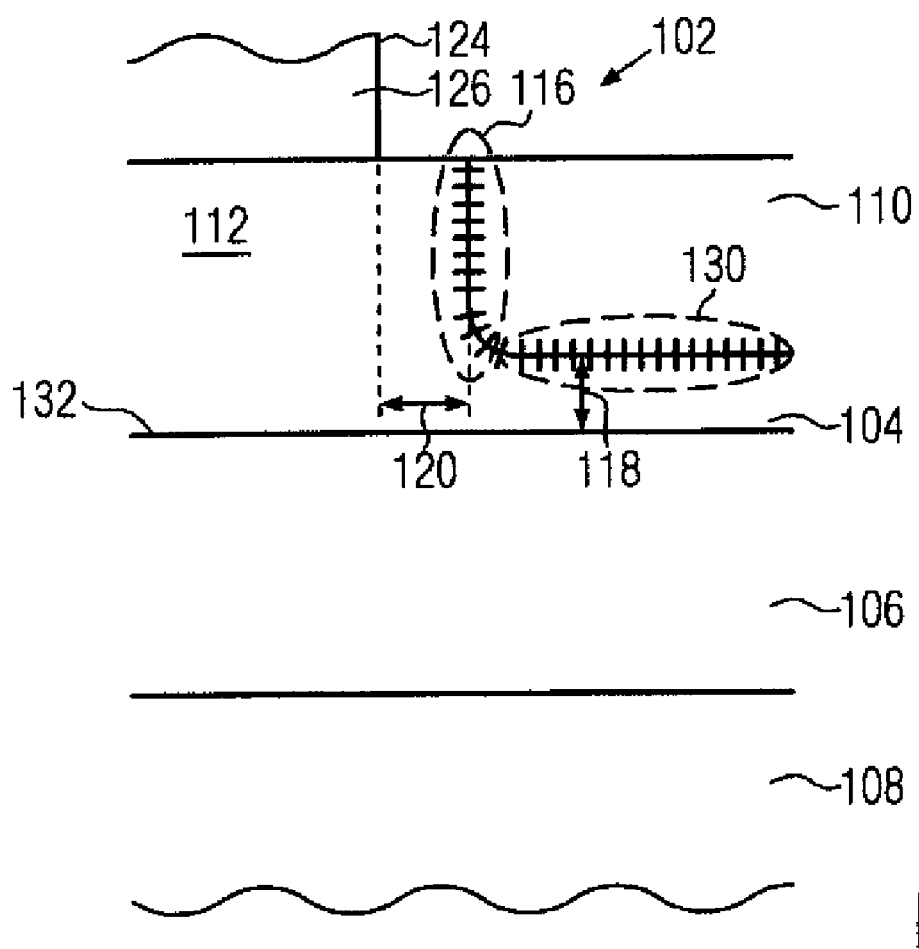
FIG. 3 schematically illustrates a partial cross-sectional view of a semiconductor device disclosed herein comprising a transistor formed on the basis of a biaxially strained first semiconductor.

FIG. 3 schematically illustrates a PMOS transistor 102 in accordance with another embodiment disclosed herein. The transistor 102 shown in FIG. 3 differs from the embodiment shown in FIG. 2 in that a first semiconductor material 104 is biaxially strained in a plane substantially parallel to a channel region 112 and substantially parallel to a surface 132 of the insulating layer 106 situated on a substrate 108. In this sense, the first semiconductor layer 104 forms a so-called strained silicon-on-insulator (SSOI) structure. In this application, the term "biaxial strain parallel to a channel region" refers to a generally lateral plane. The transistor 102 has the first semiconductor material 104 over the insulating layer 106. A source/drain region 110 comprises a second semiconductor material 109 embedded in the first semiconductor material 104. The transistor comprises a channel region 112 between the source/drain regions 110, wherein the channel region 112 comprises the first semiconductor material 104. With respect to an unstrained first semiconductor material 104, the biaxial strain in the first semiconductor material 104 acts to influence a lattice mismatch at an interface portion 116 extending in a direction substantially perpendicular to the direction of current flow through the channel region 112 between the first semiconductor material 104 and the second semiconductor material 109, so as to increase strain transfer, e.g., from the embedded second semiconductor material 109 to the channel region 112. A biaxial tensile strain in the first semiconductor 104 results in a substantially in-plane lattice constant that is larger than the lattice constant of the unstrained first semiconductor material 104. Due to the elasticity of solids, the biaxial tensile strain in the first semiconductor material 104 further results in an out-of-plane lattice constant that is smaller than the lattice constant of the unstrained first semiconductor material 104. The ratio between the in-plane and out-of-plane lattice constant is given by the Poisson number which is µ=0.45 for silicon. In the same way, a biaxial compressive strain in the first semiconductor material 104 results in an in-plane lattice constant that is smaller than the lattice constant of the unstrained first semiconductor material 104 and further results in an out-of-plane lattice constant that is larger than the lattice constant of the unstrained first semiconductor material 104.

In particular, the inventors have found that the transfer of compressive stress from the second semiconductor material 110 and from a stressed cover layer to the channel region is increased if the lattice mismatch in a direction substantially perpendicular to the direction of current flow through the channel region 112 is increased. An example of such an increased lattice mismatch is shown in the embodiment of FIG. 3. In FIG. 3, the first semiconductor material 104 is silicon and the second semiconductor material 109 is silicon/germanium. Further, the biaxial strain of the first semiconductor material 104 is a tensile strain. Accordingly, the in-plane lattice constant in a lateral direction, i.e., in a direction in a plane spanned by the directions of channel length and channel width, is larger than the lattice constant of unstrained silicon. Due to the elasticity of solids, the out-of-plane lattice constant, i.e., the vertical lattice constant in FIG. 3, is smaller than the lattice constant of unstrained silicon. Accordingly, since the lattice constant of silicon/germanium is larger than the lattice constant of silicon, the reduced lattice constant in the direction substantially perpendicular to the direction of current flow through the cannel region 112 further increases the lattice mismatch in the direction substantially perpendicular to the direction of current flow through the channel region 112. As mentioned above, this increases the compressive stress transfer into the channel region 112 and hence increases the hole mobility.

As is known from Currie et al., *J. Vac. Sci. Technol. B*, Vol. 19, p. 2268 (2001), a tensile strain in the silicon layer increases both the electron mobility of an NMOS transistor and the hole mobility of a PMOS transistor. The hole mobility of a PMOS transistor starts to increase above 15% germanium and is increased significantly as percent of germanium equivalent strain reaches 30-40%.

Taking the findings of the inventors into account, the drive current improvement of the silicon/germanium embedded in the silicon having a biaxial tensile strain comes from at least two sources, namely: (1) increased vertical lattice mismatch leading to increased compressive stress transfer and higher hole mobility as a result; and (2) increased hole mobility from biaxial tensile strain of the SSOI. In other embodiments, depending, for example, on the first and second semiconductor material and the transistor type, the biaxial strain may be a compressive strain.

In an embodiment disclosed herein, the biaxial strain of the first semiconductor material 104 is of a magnitude such that the lateral lattice constant of the first semiconductor material 104 is substantially equal to the lattice constant of the unstrained second semiconductor material 109. Hence, there is substantially no lateral lattice mismatch between the biaxially strained first semiconductor material 104 and the second semiconductor material 109. An example herefor is the transistor shown in FIG. 3. Here, the biaxial tensile strain of the first semiconductor material 104, e.g., silicon, is such that the lattice parameter is substantially equal to the lattice parameter of the unstrained silicon/germanium alloy. However, even in this case, experiments have shown that the drive current improvement from embedded silicon/germanium is equal if not more for the SSOI than for the SOI.

In still other embodiments, the biaxial strain may be of a magnitude such that the biaxially strained lattice of the first semiconductor material 104 has a lattice constant different from the lattice constant of the unstrained embedded second semiconductor material 109. If the second semiconductor material 109 is epitaxially grown on this strained lattice of the first semiconductor material 104, a compressive stress or a tensile stress may be generated in the second semiconductor material 109, depending on the lateral lattice constant of the biaxially strained lattice of the first semiconductor material 104.

In still another embodiment disclosed herein, the interface portion 116 extends to a depth such that the thickness 118 of the first semiconductor material 104 under the second semiconductor material 109 is approximately 10 nm or less. The thickness 118 may be within the same intervals described regarding the thickness 18 of the first semiconductor material 4 in FIGS. 1 and 2. Further, the lateral distance 120 of the interface portion 116 from the channel region 112 may be of the same value as the lateral distance 20 of the transistor 2 illustrated in FIG. 1.

The transistor shown in FIG. 3 does not comprise a stressed cover layer. In still other embodiments, the transistor 102 may comprise a stressed cover layer, e.g., a strained etch stop layer.

In the case of a PMOS transistor shown in FIG. 3, such a stressed cover layer may be a compressive cover layer.

Figure 4:
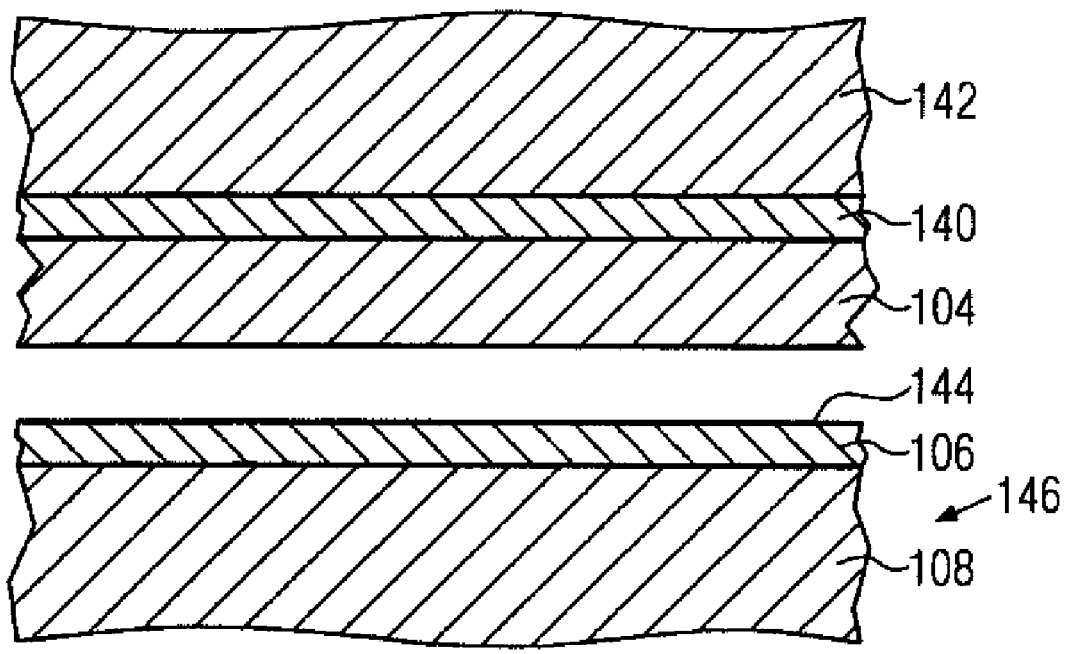
FIGS. 4-8 schematically illustrate cross-sectional views of a semiconductor device of the type shown in FIG. 3 during various manufacturing stages.

A method of manufacturing a transistor of the type shown in FIG. 3 is described with reference to FIGS. 4-8. FIG. 4 shows a template semiconductor 140 on a suitable substrate 142. In the embodiment shown in FIG. 4, the template semiconductor 140 is silicon/germanium and the substrate 142 is silicon. Numerous variations may be employed as known in the art. For example, the template semiconductor 140 may be formed on an oxidized silicon substrate. On the template semiconductor 140, a first semiconductor material 104, silicon in the depicted embodiment, is epitaxially grown. During the epitaxial growth process of the first semiconductor material 104, the template semiconductor 140 acts as a template, wherein, depending on the degree of lattice mismatch to the underlying template semiconductor layer 140, the newly deposited first semiconductor material 104 may be deposited so as to substantially take on the crystallographic configuration given by the template semiconductor 140. Thereby, a certain degree of strain is endowed to the newly grown first semiconductor material 104. Since the silicon/germanium has a larger lattice constant than the silicon, the silicon grows with a biaxial tensile strain on the silicon/germanium template. The larger the germanium content of the silicon/germanium template, the larger the tensile strain in the first semiconductor material 104. According to one embodiment, the germanium content in the template semiconductor 140 is between approximately 10-50%. According to another embodiment, the germanium content in the template semiconductor is between approximately 15-40%. According to still another embodiment, the germanium content in the template semiconductor is between approximately 20-40%. According to still another embodiment, the germanium content in the template semiconductor is between approximately 25-40%. According to still another embodiment, the germanium content in the template semiconductor is between approximately 25-35%. According to still another embodiment, the germanium content in the template semiconductor is between approximately 20-30%. Other template semiconductors may be selected, depending on the composition of the first semiconductor material and on the desired type of stress in the first semiconductor material.

In accordance with one embodiment disclosed herein, the first semiconductor 104 on the template semiconductor 140 is then bonded to a surface 144 of a target substrate 146. The target substrate 146 is sometimes called handle wafer. In one embodiment disclosed herein, the surface 144 of the target substrate 146 is an insulating surface. For example, the target substrate 146 may consist of a substrate 108 covered by the insulating layer 106, as shown in FIG. 4. In the embodiment shown in FIG. 4, the substrate 108 is silicon and the insulating layer 106 is silicon dioxide. However, any suitable material for the substrate 108 and the insulating layer 106 known in the art may be used instead. In another embodiment, the target substrate 146 may consist of an insulating material, e.g., glass. According to another embodiment disclosed herein, the insulating layer 106 may be formed at a surface of the first semiconductor material 104 before the bonding process, e.g., by oxidizing a surface of the first semiconductor material 104. In this way, the substrate 108 does not need to have an insulating layer 106 in order to form a strained semiconductor on insulator.

Figure 5:
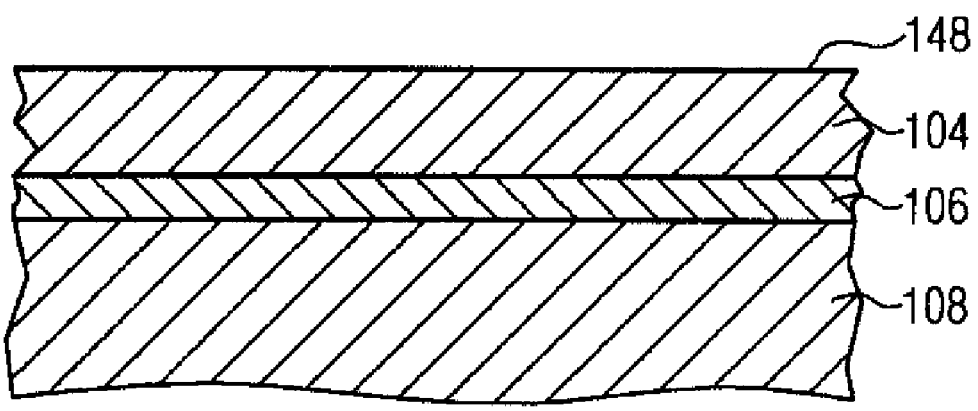

The bonding process may be any suitable process for bonding the first semiconductor material 104 to the target semiconductor 146. In particular, the bonding process may be any suitable process for bonding the first semiconductor material 104 to an insulating material 106. After bonding the first semiconductor material 104 to the target substrate 146, the template semiconductor 140 and its substrate 142 is removed, thereby exposing a surface 148 of the strained first semiconductor material 104 which is opposite to the substrate 108. In this way, the strained silicon 104 on insulator 106 shown in FIG. 5 is formed. Experiments turned out that the strained first semiconductor material 104 maintains the original strain from the template semiconductor 140 even after removal of the template semiconductor 140 (together with the substrate 142), i.e., the first semiconductor material 104 maintains the strain of the silicon/germanium template. The removal to the template semiconductor 140 may be performed by any suitable process, including chemical mechanical polishing (CMP), etching, splitting and the like.

Figure 6:
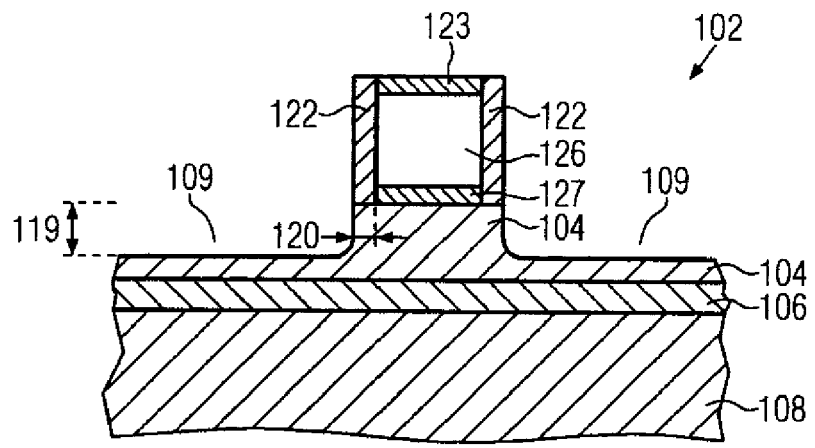

FIG. 6 shows the biaxially strained first semiconductor layer 104 on insulator 106 in a further advanced manufacturing stage, wherein a gate insulation layer 127 of a transistor 102 has been formed on the first semiconductor material 104. On the gate insulation layer 127, a gate electrode 126 has been formed. The gate electrode 126 may be encapsulated by respective sidewall spacers 122 and an appropriate cap layer 123 as shown in FIG. 6. The semiconductor device shown in FIG. 6 may be formed on the basis of well-established MOS techniques. During the patterning of the gate electrode 126, the cap layer 123 may also be formed and, thereafter, the sidewall spacers 122 may be formed on the basis of well-established techniques. Further, in FIG. 6, an etch process has been performed to create recesses 109r adjacent to the gate electrode with a corresponding offset 120 defined by the sidewall spacers 122. The recesses 109r are formed to a predetermined depth 119. Possible ranges for the offset 120 are the same as specified for the offset 20 with regard to the embodiment of FIG. 1.

Figure 7:
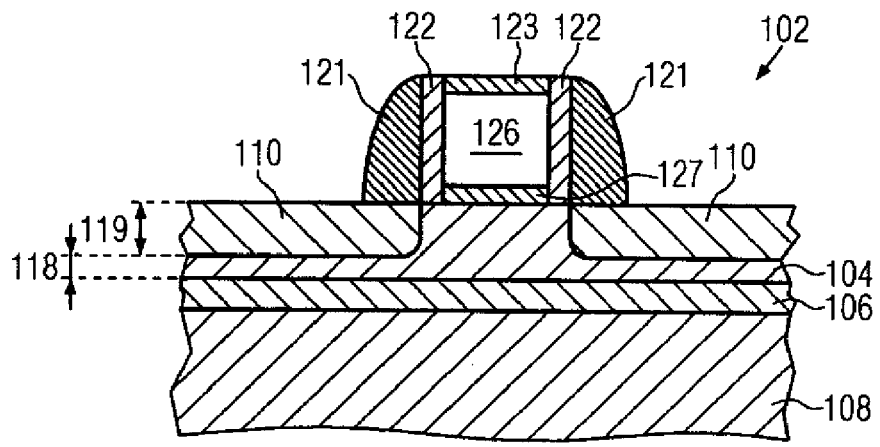

FIG. 7 shows the transistor 102 in a further advanced manufacturing stage. Here, a second semiconductor material 109 has been epitaxially grown in the recesses 109r. During the epitaxial growth process of the second semiconductor material 110, the first semiconductor material 104 may act as a template, wherein, depending on the degree of lattice mismatch to the underlying first semiconductor layer 104, the newly deposited second semiconductor material 109 may be deposited so as to substantially take on the crystallographic configuration given by the first semiconductor material 104. Thereby, a certain degree of strain is endowed to the newly grown second semiconductor material 109, depending on the lateral lattice mismatch of the first semiconductor material 104 and the second semiconductor material 109.

According to one embodiment disclosed herein, the composition of the second semiconductor material 109 formed in the recesses is the same as the composition of the template semiconductor which has been used to induce the biaxial strain in the first semiconductor material 104. In this case, and when the strain could be maintained through the previous processing steps, which was proved by experiment for the illustrated embodiments of FIGS. 3-8, the in-plane lattice constant of the unstrained second semiconductor 109 matches the in-plane lattice constant of the biaxially strained first semiconductor material. In the embodiment shown throughout FIGS. 3-8, the second semiconductor material 109 and the template semiconductor material 140 is a silicon/germanium alloy containing approximately 20% germanium. In other embodiments, the second semiconductor material 109 as well as the template semiconductor material 140 may both contain germanium to a different amount. In still further embodiments, the germanium content in the second semiconductor material 109 may differ from the germanium content in the template semiconductor 140. In still further embodiments, the second semiconductor material 109 may comprise different elements compared to the template semiconductor material 140. It should be understood that, during deposition of the second semiconductor material 109 in the recesses 109r, the germanium content or any further dopant concentration may be incorporated as is required by device characteristics. Further, a desired lateral or vertical dopant concentration profile may be generated in the second semiconductor material 109 by any appropriate method, e.g., by an implantation sequence, possibly in combination with a respective intermediate manufacturing state of the sidewall spacers 121, 122 so as to obtain the required in-plane and out-of-plane dopant profile (not shown).

As illustrated in FIG. 7, the predetermined depth 119 of the recesses 109r correspond to a respective thickness 118 of the first semiconductor material 104 under the second semiconductor material 110. The thickness 118 of the first semiconductor material 104 may vary particularly in one of the ranges specified for the thickness 18 with regard to FIG. 1. For example, according to one embodiment, the thickness of the first semiconductor layer 104 under the second semiconductor layer 110 is approximately 10 nm or less, e.g., 5 nm. It should be understood that, in a case where the thickness of the first semiconductor material 104 varies under the second semiconductor material 109, the term "thickness of the first semiconductor material 104 under the second semiconductor material 109" is the smallest thickness value the first semiconductor 104 takes on under the second semiconductor material 109. Further, in FIG. 7, the sidewall spacers 122 have been formed using the sidewall spacers 121 as a template. As mentioned above, the sidewall spacers 122 may serve as an implantation mask for dopant material.

Figure 8:
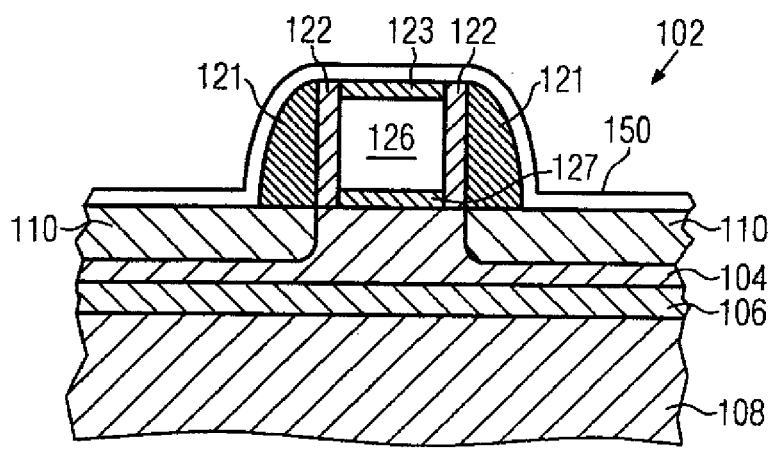

FIG. 8 shows the transistor 102 in a further advanced manufacturing stage. Herein, the transistor 102 has been covered with a stressed layer 150, e.g., a strained etch stop layer. For example, the stressed layer 150 may be formed of $SiO_2$. In the embodiment illustrated in FIG. 8, the sidewall spacers 121, 122 have been maintained under the stressed cover layer 150. Experiments have shown that, regarding a drive current improvement from a compressive overlayer over the exemplary P-channel transistor 102, the approximately 20% germanium embedded silicon/germanium in a biaxially strained silicon (silicon/germanium template semiconductor with approximately 20% germanium) is just as effective, if not more, as it is on unstrained silicon-on-insulator. Since, due to the equal germanium content in the template semiconductor as well as in the embedded silicon/germanium, a lattice mismatch is generated only in the out-of-plane direction. This already illustrates the huge potential of the embedded silicon/germanium on SSOI.

According to another embodiment, the sidewall spacer 121 is removed before the deposition of the stressed layer 150. According to another embodiment, the sidewall spacer 121 and the sidewall spacer 122 are removed before the deposition of the stressed layer 150. The removal of a sidewall layer 121, 122 may be performed by any appropriate method, e.g., by a selective etch process.

Figure 9:
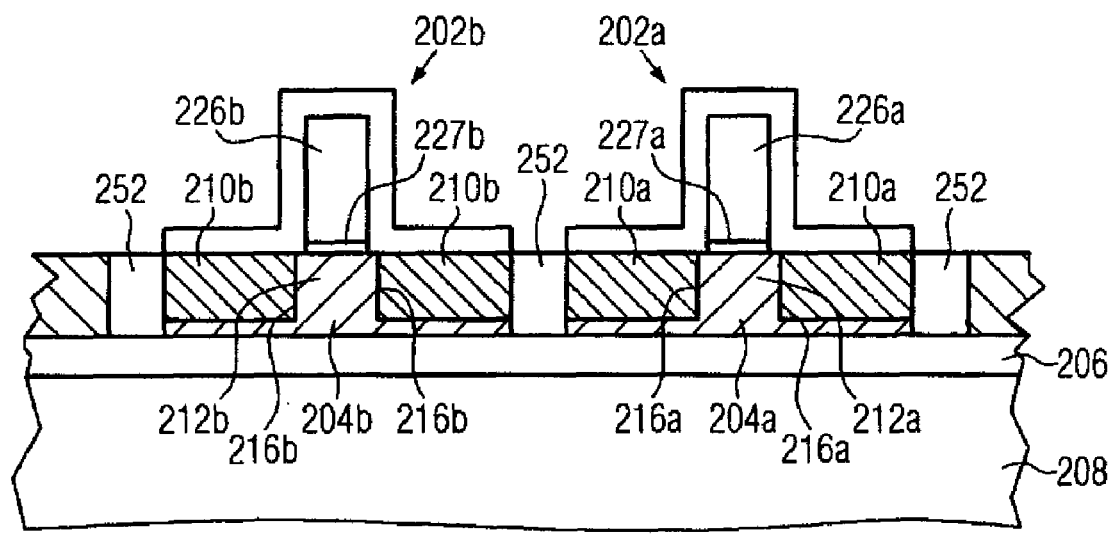
FIGS. 9-15 schematically illustrate cross-sectional views of a semiconductor device disclosed herein comprising two different transistor types formed on the basis of a biaxially strained first semiconductor having regions of different strain.

FIGS. 9-15 illustrate various other embodiments that are disclosed herein, e.g., the formation of different transistor types with different strain levels on the same substrate. FIG. 9 shows an exemplary embodiment of a semiconductor device 201 having a first type of transistor 202a and a second type of transistor 202b. The transistors 202a, 202b are isolated from each other and from other transistors and/or devices by isolation structures 252, such as a shallow trench isolation and the like. In FIG. 9, the first type transistor is a P-channel transistor and the second type transistor is an N-channel transistor.

The first transistor 202a comprises a first semiconductor material 204a over an insulator 206. The first semiconductor material 204a is biaxially strained. A source/drain region comprising a second semiconductor material 210a is embedded in the first semiconductor material 204a. A channel region 212a of the first transistor 202a extends between the source/drain region, the channel region 212a comprising the first semiconductor material 204a. With respect to an unstrained first semiconductor material, the biaxial strain in the first semiconductor material 204a acts to influence a lattice mismatch at an interface portion 216a extending in a direction crosswise the channel region 212a between the first semiconductor material 204a and the second semiconductor material 210a so as to increase strain transfer from the second semiconductor material 210a to the channel region 212a. A gate insulating layer 227 is formed over the channel region 212a. A gate electrode 226 is formed on the gate insulating layer 227.

A third semiconductor material 204b is formed over the isolator 206. The first semiconductor material 204a and the third semiconductor material 204b are separated by an appropriate isolation structure, e.g., a shallow trench isolation structure 252. The trenches of trench isolation structure 252 may extend down to the insulator 206. The third semiconductor material 204b is biaxially strained. A source/drain region of the second transistor 202b comprises a fourth semiconductor material 210b embedded in the third semiconductor material 204b. A channel region 212b of the second transistor 202b extends between the source/drain region, the channel region 212b comprising the third semiconductor material 204b. With respect to an unstrained third semiconductor material, the biaxial strain in the third semiconductor material 204b acts to influence a lattice mismatch at an interface portion 216b extending in a direction crosswise the channel region 212b between the third semiconductor material 204b and the fourth semiconductor material 210b so as to increase strain transfer from the fourth semiconductor material 210b to the channel region 212b. A gate insulating layer 227b is formed over the channel region 212b. A gate electrode 226b is formed on the gate insulating layer 227b.

The first semiconductor material 204a and the third semiconductor material 204b differ in strain state. A difference in strain state includes different strain values of the same strain type as well as different strain types. For example, in the embodiment illustrated in FIG. 9, the strain difference in strain state is a difference in strain value, whereas both the first and the third semiconductor material exhibit a tensile strain. In other embodiments, the first semiconductor material may exhibit a tensile strain and the third semiconductor material may exhibit a compressive strain. In still other embodiments, the first semiconductor material exhibits compressive strain and the third semiconductor material exhibits a tensile strain. Independently of the strain state, the first and third semiconductor material may or may not differ in composition. According to one embodiment, the first semiconductor material 204a and the third semiconductor material 204b are of the same composition. For example, in the embodiment illustrated in FIG. 9, the first semiconductor material 204a and the third semiconductor material 204b are made of silicon. In other embodiments, the first semiconductor material 204a and the third semiconductor material 204b differ in composition. In still other embodiments, the first semiconductor material and the third semiconductor material are substantially identical, i.e., according to such an embodiment, the first and the third semiconductor material may consist of a silicon layer having the same strain state and the same composition. Such a silicon layer may be produced, e.g., as described with regard to FIGS. 4-5.

The first transistor 202a, being a P-channel transistor (PMOS), may be manufactured by embodying the features disclosed above with regard to the transistor 102. The second transistor 202b may be provided in the form of an N-channel transistor (NMOS). Although the NMOS transistor 202b shown in FIG. 9 has recessed fourth semiconductor materials, other embodiments may be manufactured without a recessed fourth semiconductor material. One advantage of forming a P-channel transistor and an N-channel transistor on materials with a different biaxial strain state is that the individual performance of the respective transistor may be enhanced. A further advantage is that the balance in performance between the P-channel transistor and the N-channel transistor may be improved.

Figure 10:
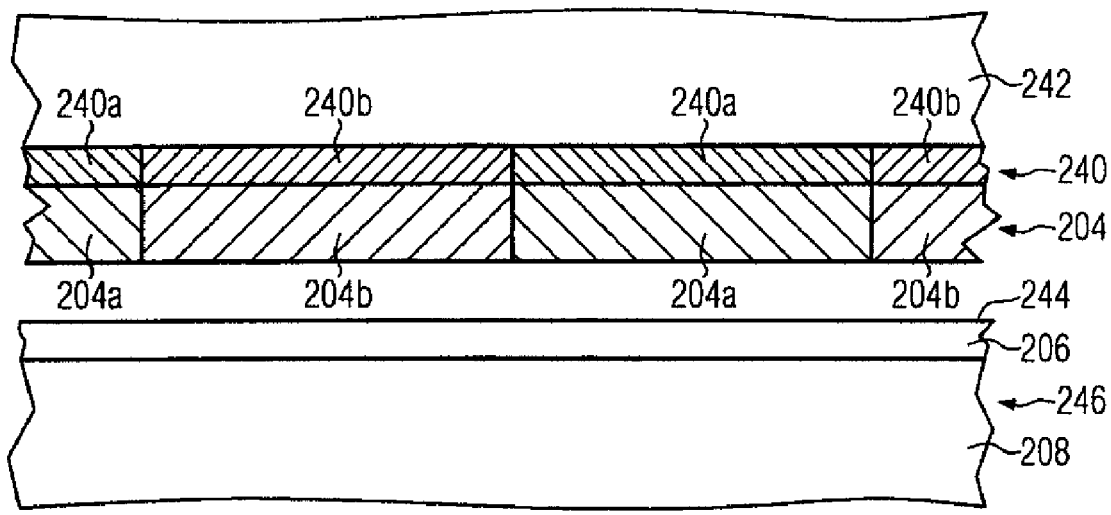

FIGS. 10-15 illustrate an exemplary embodiment wherein a semiconductor device having two different transistor types may be manufactured as two semiconductor materials having different biaxial strain. FIG. 10 shows a template semiconductor 240 on a suitable substrate 242. In the embodiment shown in FIG. 10, the substrate 242 is silicon. Numerous variations may be employed as known in the art. For example, the template semiconductor 240 may be formed on an oxidized silicon substrate. The template semiconductor 240 comprises regions of two different compositions, a first template semiconductor 240a and a second template semiconductor 240b. According to one embodiment, the first template semiconductor 240a and the second template semiconductor 240b may be formed of the same elements, e.g., silicon and germanium, but have different compositions, e.g., the first template semiconductor 240a may have a germanium content of 35%, whereas the second template semiconductor 240b may have a germanium content of approximately 20%. In still other embodiments, the first template semiconductor 240a is silicon/germanium and the second template semiconductor 240b is silicon/carbon. In embodiments wherein at least one of the first template semiconductor and the second template semiconductor is silicon/germanium, it should be understood that any of these silicon/germanium materials may have a composition as disclosed with regard to the template semiconductor material 140.

Figure 11:
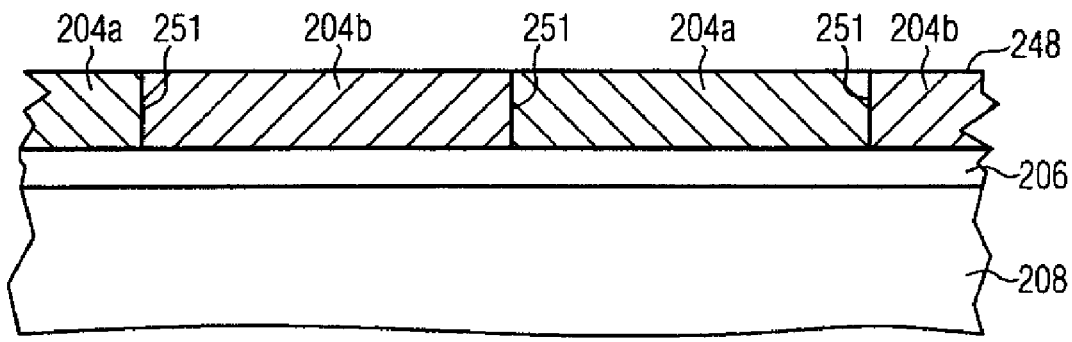

In the embodiment illustrated in FIGS. 10-11, on the first template semiconductor 240a and the second template semiconductor 240b, a first semiconductor layer 204 is grown which covers both the first template semiconductor 240a and the second template semiconductor 240b. In the illustrated embodiment in FIG. 10, the first semiconductor material 204 is silicon. In other embodiments, the semiconductor layer 204 may be any other suitable material for the manufacture of transistors, in particular N-channel transistors and P-channel transistors. For example, the semiconductor layer 204 may be of a semiconductor alloy, e.g., silicon/germanium. Due to the different composition of the first template semiconductor 240a and the second template semiconductor 240b, different strain states are generated in the first semiconductor layer 204. For example, in the illustrated embodiment, since the first template semiconductor material has a higher germanium content, the biaxial tensile strain induced in a first portion 204a of the first semiconductor layer 204, which has been grown on the first template semiconductor 240a, is higher than the biaxial tensile strain induced in a second portion 204b of the first semiconductor layer 204 which has been grown on the second template semiconductor 240b.

In accordance with another embodiment disclosed herein, the first semiconductor material 204 on the template semiconductor 240 is then bonded to a surface 244 of a target substrate 246. The target substrate 246 is sometimes called a handle wafer. The target substrate 246 may have the same features as disclosed with regard to the target substrate 146 above. For example, the target substrate 146 may consist of a substrate 208 covered by an insulator layer 206.

As stated with regard to the embodiment of FIGS. 4-5, the bonding process may be any suitable process for bonding the first semiconductor material 204 to the target semiconductor 246. In particular, the bonding process may be any suitable process for bonding the first semiconductor material 204 to an insulator 206. After bonding the first semiconductor material 204 to the target substrate 246, the template semiconductor 240 and its substrate 242 are removed, thereby exposing a surface 248 of the strained first semiconductor material 204 which is opposite to the substrate. In this way, the strained silicon 204 on insulator 206 shown in FIG. 11 is formed, wherein the first portion 204a of the first semiconductor layer 204 corresponds to the first semiconductor material 204a in FIG. 9 and the second portion 204b of the first semiconductor layer 204 corresponds to the third semiconductor material 204b in FIG. 9. The first semiconductor material and the third semiconductor material form an interface 251 therebetween. The removal to the template semiconductor 240 may be performed by any suitable process, including chemical mechanical polishing (CMP), etching, splitting and the like.

Figure 12:
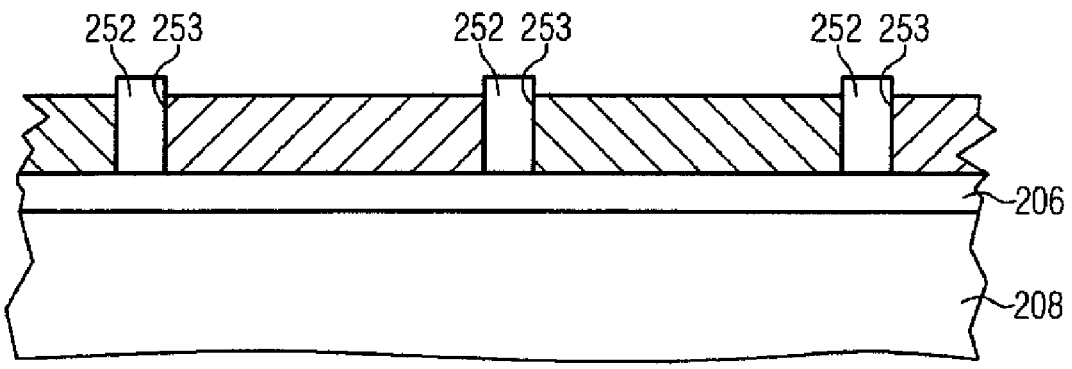

FIG. 12 shows the semiconductor device in a further advanced manufacturing stage. The interfaces 251 between the first semiconductor material 204a and the second semiconductor material 204b have been removed, e.g., down to the insulator 206, to form openings 253. The openings 253 have been filled with an appropriate material to form shallow trench isolation structures 252.

Figure 13:
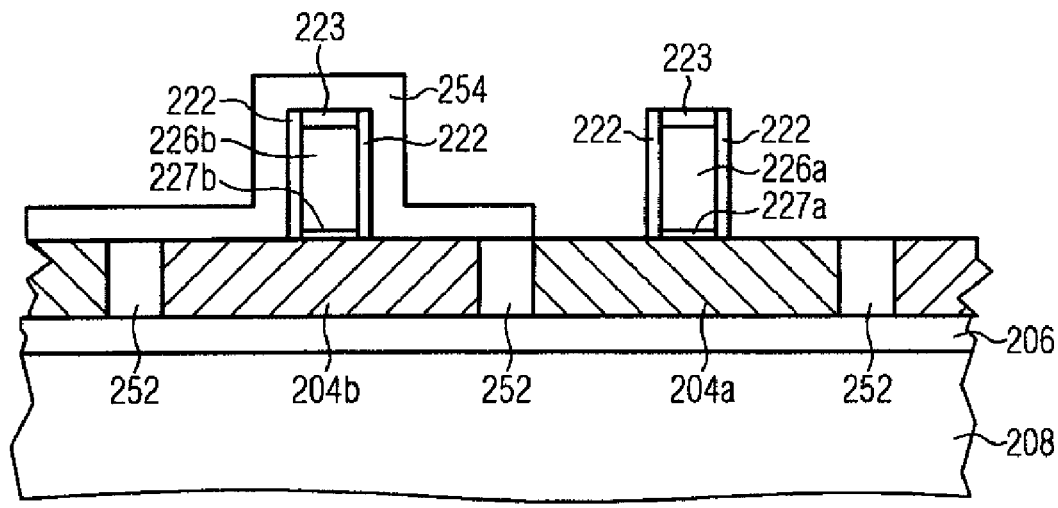

FIG. 13 shows the semiconductor device in a still further advanced manufacturing stage. A planarization step has been performed to obtain a planar surface topography. In other embodiments, such a planarization step may be omitted. As shown, respective gate electrodes 226a, 226b have been formed on respective gate insulation layers 227a, 227b. The gate electrode is encapsulated by respective sidewall spacers 222 and an appropriate cap layer 223. The second transistor has been completely covered by a mask layer 254.

Figure 14:
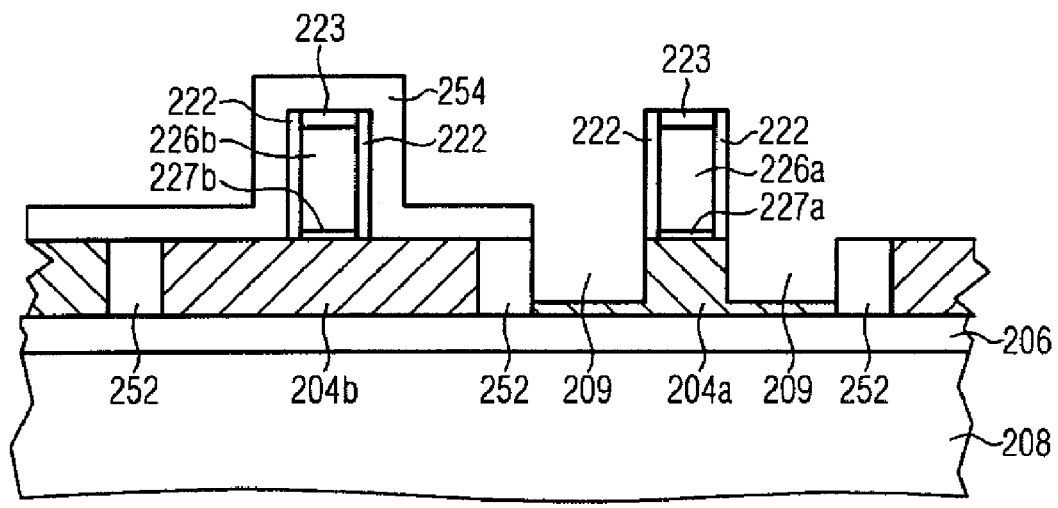

FIG. 14 shows the semiconductor device in a still further advanced manufacturing stage. Recesses 209 have been selectively formed by performing an anisotropic etch process well known in the art. In particular, the formation of the recesses 209 may be performed as discussed in detail with regard to FIG. 6.

Figure 15:
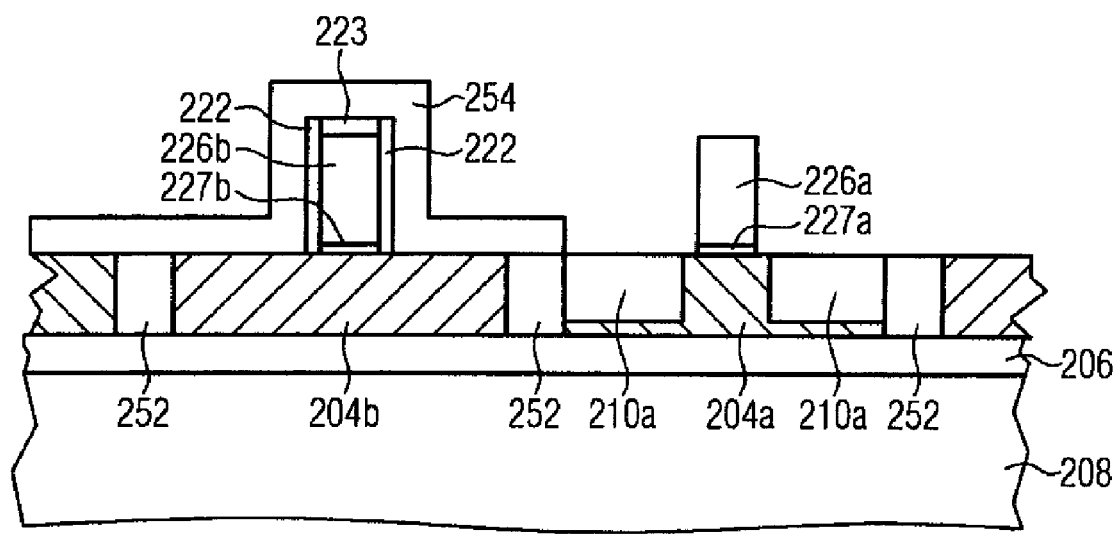

FIG. 15 shows the semiconductor device in a still further advanced manufacturing stage. Herein, the recesses 209 have been filled by epitaxially growing a second semiconductor material 210 on the first semiconductor material, as discussed in detail with regard to FIG. 7. Thereafter, the sidewall spacers 222 and the cap layer 223 have been removed to expose the gate electrode 226a. Such a removal can be performed by a selective etch process which is well known in the art for a variety of materials. Subsequently, a stressed cover layer is deposited (not shown in FIG. 15) so as to obtain the first transistor 202a shown in FIG. 9. Hereinafter, the second transistor 202b may be formed in a similar manner to obtain the second transistor 202b shown in FIG. 9 or to obtain a second transistor as mentioned with regard to FIG. 9.

It should be mentioned that the exemplary method of manufacture of the first transistor 202a has been described roughly for illustrative purposes. It should be understood that further steps may be required, in particular doping processes to obtain a desired dopant profile in the first, second, third and fourth semiconductor materials 204a, 204b, 210a, 210b. The manufacturing of respective transistors at the first semiconductor material 204a and the second semiconductor material 204b may be preformed on the basis of any appropriate processes known in the art.

Figure 16:
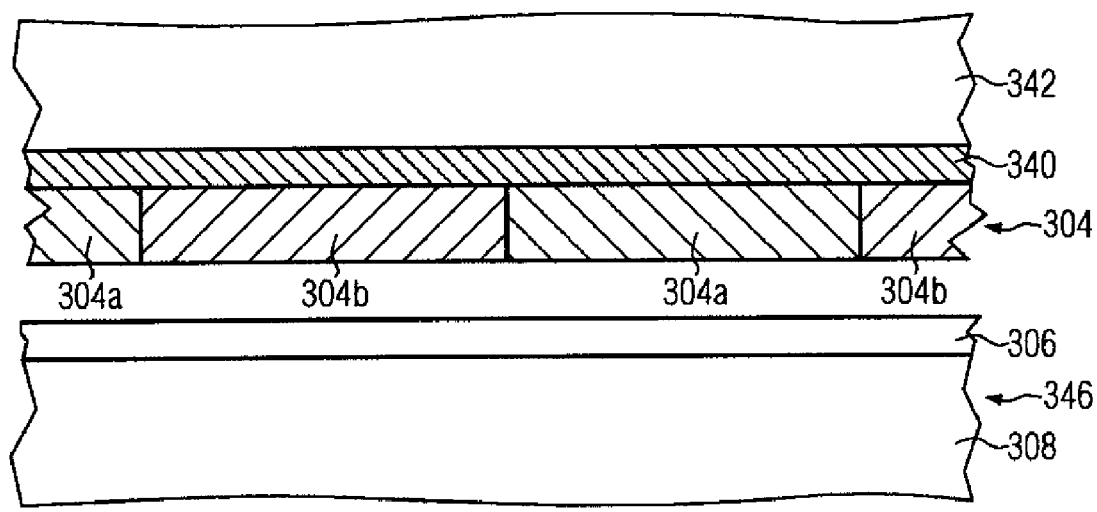
FIGS. 16-17 schematically illustrate cross-sectional views of a semiconductor device disclosed herein comprising regions of different biaxially strained semiconductor compositions.
Figure 17:
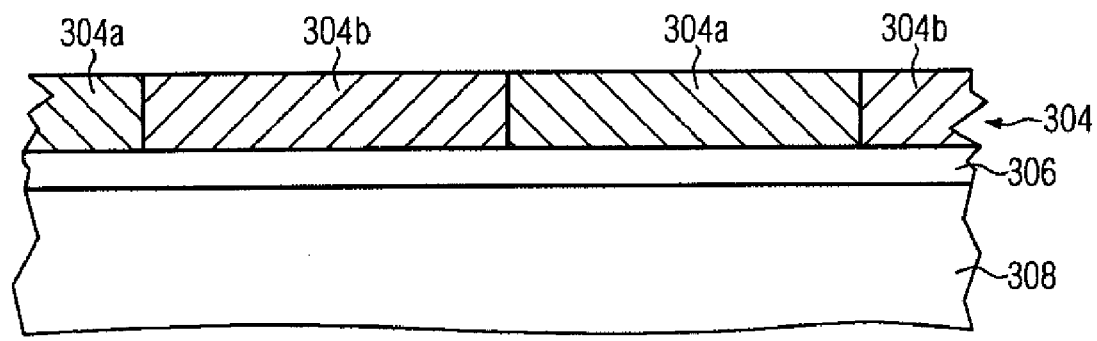

Whereas, in the embodiment illustrated in FIGS. 10-15, the first semiconductor material 204a and the third semiconductor material 204b are formed from the same material layer 204 and differ only in strain, according to another embodiment, a first semiconductor material 304a and a third semiconductor material 304b which differs from the first semiconductor material 304a in composition are selectively grown over a common template semiconductor material 340 provided on a substrate 342, as illustrated in FIG. 16. Due to different lattice constant of the first semiconductor material and the third semiconductor material, different strain states may be obtained in the first semiconductor material 304a and the third semiconductor material 304b. Similar to FIGS. 4 and 5, as well as FIGS. 10 and 11, by wafer bonding and subsequent removal of the template semiconductor 340, a strained semiconductor-on-insulator may be formed, the strained semiconductor having regions 304a, 304b of different composition and/or strain. The semiconductor unit comprising the strained semiconductor layer 304 on the insulator 306, which is in turn carried by a substrate 308, may be used instead of the semiconductor layer 204 on insulator 206 and substrate 208 in the embodiments of FIGS. 9-15. In such an application, the first semiconductor material 304a and the third semiconductor 304b material may be selected to optimize the performance of the first and second transistor 202a and 202b. The manufacturing of respective transistors at the first semiconductor material 304a and the second semiconductor material 304b may be preformed on the basis of any appropriate processes known in the art.

The principles of the subject matter disclosed herein can be used with a high degree of process compatibility with conventional approaches. Consequently, enhanced overall device performance may be obtained without unduly contributing to process complexity. In one illustrative embodiment, the second semiconductor material may be comprised of silicon/germanium, the patterned silicon/germanium in the active region of the P-channel transistor may provide enhanced hole mobility therein. In other illustrative embodiments, a semiconductor having a smaller natural lattice constant compared to silicon may be used, thereby inducing inverse strain characteristics compared to the silicon/germanium. In some illustrative embodiments, the formation of a semiconductor material contained in both transistors may be performed in a common process sequence for both transistors, thereby providing reduced process complexity, while, in other illustrative embodiments, enhanced flexibility on designing the respective characteristics with respect to dopant concentration, type of semiconductor material, concentration gradients therein, may be achieved by separately providing a respective semiconductor alloy in different transistor types. For this purpose, in some illustrative embodiments, efficient selective epitaxial growth techniques may be used in combination with selective etch steps for recessing one or more of the active regions of the transistors in a common process and subsequently refilling the recesses with an appropriate semiconductor material. In still other illustrative embodiments, a semiconductor material, e.g., the second and the fourth semiconductor material, may be formed on the basis of an ion implantation process, wherein appropriate pre-amorphization steps may be used in combination with advanced anneal techniques for re-crystallizing the active regions after incorporating the desired atomic species for forming the semiconductor alloy. For this purpose, substantially the same process steps may be used as are previously described with respect to FIGS. 4-8 and 9-15, wherein, however, instead of selectively recessing the active regions and refilling the same, a corresponding mask may be used for an implantation process without requiring a selective removal of material of the active region. Furthermore, in this case, the corresponding mask layers may be provided in the form of resist masks, thereby contributing to a reduced process complexity. Further, also the template layer 140, 240, 340 may be formed by an ion implantation process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a base comprising a biaxially strained first semiconductor material and a second semiconductor material laterally adjacent said first semiconductor material, said second semiconductor material having a different strain state than said biaxially strained first semiconductor material;
bonding said base including said first and second semiconductor materials to a substrate;
exposing at least a first portion of said biaxially strained first semiconductor material and a second portion of said second semiconductor material at a surface opposite said substrate;
embedding a third semiconductor material in said biaxially strained first semiconductor material such that a portion of said third semiconductor material defines at least a portion of a plurality of source/drain regions of a first transistor, wherein said source/drain regions have a channel region therebetween, said channel region comprising said biaxially strained first semiconductor material, said biaxial strain in said first semiconductor material acting to influence a lattice mismatch at an interface portion between the first semiconductor material in the channel region and the third semiconductor material so as to increase a strain transfer into the channel region; and
forming a second transistor in said second semiconductor material.

2. The method of claim 1, wherein one of the first transistor and the second transistor is a P-channel transistor and the other is an N-channel transistor.

3. The method of claim 1, wherein providing said base includes:
providing a template semiconductor material;
selectively growing said first semiconductor material over said template semiconductor material, wherein a lattice constant of said template semiconductor material is different from a lattice constant of said first semiconductor material, to thereby grow said first semiconductor material with said biaxial strain; and
selectively growing said second semiconductor material over said template semiconductor material.

4. The method of claim 1, wherein providing said base includes:
- providing a first template semiconductor material;
- providing a second template semiconductor material, said second template material having a lattice constant different from a lattice constant of said first template semiconductor material; and
- growing said first semiconductor material on said first template semiconductor material and on said second template semiconductor material, wherein a lattice constant of said first template semiconductor material is different from a lattice constant of said first semiconductor material, to thereby grow said first semiconductor material with said biaxial strain.

5. The method of claim 3, wherein exposing said strained first semiconductor material and said second semiconductor material comprises removing said template semiconductor material from said strained first semiconductor material and said second semiconductor material.

6. The method of claim 1, wherein said first semiconductor material is silicon.

7. The method of claim 1, wherein said third semiconductor material is a silicon/germanium alloy.

8. The method of claim 3, wherein the template semiconductor material is a silicon/germanium alloy.

9. The method of claim 3, wherein said third semiconductor material is of the same composition as said template semiconductor.

10. The method of claim 1, wherein said biaxial strain in said first semiconductor material is a first type of strain and the third semiconductor material induces a second type of strain in the channel region, the second type of strain being different from the first type of strain.

11. The method of claim 10, wherein:
- said first type of strain is a tensile strain and said second type of strain is a compressive strain; and
- compared to an unstrained first semiconductor material, said biaxial strain in said first semiconductor material acts to increase a lattice mismatch at an interface portion between the first semiconductor material in the channel region and the third semiconductor material.

12. The method of claim 1, wherein embedding said third semiconductor material comprises:
- forming a cavity in said biaxially strained first semiconductor material by selectively removing a portion of said first semiconductor material; and
- forming said third semiconductor in said cavity.

13. The method of claim 1, further comprising forming a stressed layer over said first transistor.

14. The method of claim 1, further comprising:
- removing a portion of said first and second semiconductor materials at an interface defined therebetween; and
- forming an isolation structure at said interface.

* * * * *